(12) United States Patent
Chaware et al.

(10) Patent No.: US 11,402,440 B2
(45) Date of Patent: Aug. 2, 2022

(54) METHODS AND APPARATUS FOR TRIMMING A MAGNETIC FIELD SENSOR

(71) Applicant: ALLEGRO MICROSYSTEMS, LLC, Worcester, MA (US)

(72) Inventors: Virag V. Chaware, Nashua, NH (US); Jesse Lapomardo, Pembroke, NH (US); David J. Haas, Concord, NH (US)

(73) Assignee: ALLEGRO MICROSYSTEMS, LLC, Worcester, MA (US)

(*) Notice: Subject to any disclaimer, the term of this patent is extended or adjusted under 35 U.S.C. 154(b) by 217 days.

(21) Appl. No.: 14/801,997

(22) Filed: Jul. 17, 2015

(65) Prior Publication Data
US 2017/0016965 A1    Jan. 19, 2017

(51) Int. Cl.
*G01R 33/00* (2006.01)
*G01R 33/07* (2006.01)

(52) U.S. Cl.
CPC ..... *G01R 33/0023* (2013.01); *G01R 33/0017* (2013.01); *G01R 33/0035* (2013.01); *G01R 33/07* (2013.01)

(58) Field of Classification Search
CPC .. G01R 33/0023; G01R 33/07; G01R 33/072; G01R 33/075; G01R 33/077; G01R 33/017; G01R 33/0035; G01R 33/09; G01R 33/091; G01R 33/093; G01R 33/095; G01R 33/096; G01R 33/098; G01R 33/0017; G01R 33/0029; G01B 7/14; G01B 7/30; G01D 5/142; G01D 5/145; G01D 5/147; G01D 5/16; G01D 5/165

USPC ......................................................... 324/251
See application file for complete search history.

(56) References Cited

U.S. PATENT DOCUMENTS

| | | | |
|---|---|---|---|
| 6,615,155 B2* | 9/2003 | Gilboa | A61B 5/06 324/207.17 |
| 7,923,996 B2* | 4/2011 | Doogue | G01R 33/0023 324/251 |
| 8,447,556 B2 | 5/2013 | Friedrich et al. | |
| 8,542,010 B2* | 9/2013 | Cesaretti | G01R 35/005 324/202 |
| 8,680,846 B2 | 3/2014 | Cesaretti et al. | |

(Continued)

OTHER PUBLICATIONS

Overview of Microprocessors, Chapter 1, obtained from http://www.science.smith.edu/~jcardell/Courses/EGR328/Readings/uProc%20Ovw.pdf, obtained on Dec. 17, 2020.*

(Continued)

*Primary Examiner* — David M Schindler
(74) *Attorney, Agent, or Firm* — Daly, Crowley, Mofford & Durkee, LLP

(57) ABSTRACT

Method and apparatus for trimming a magnetic field sensor having a first magnetic field sensing element. The trimming includes the use of a curve for normalized sensitivity of the first magnetic field sensing element derived from a first curve corresponding to current through a coil in a first direction at a first time. This produces a field affecting the first magnetic field sensing element versus an external field. The trimming further includes a second curve corresponding to current through the coil in a second direction opposite to the first direction at a second time to produce a field affecting the first magnetic field sensing element versus an external field.

22 Claims, 17 Drawing Sheets

(56) References Cited

U.S. PATENT DOCUMENTS

| | | | | |
|---|---|---|---|---|
| 8,736,260 | B2* | 5/2014 | Foletto | G01D 5/247 324/173 |
| 9,383,425 | B2* | 7/2016 | Milano | G01R 33/072 |
| 2007/0185397 | A1* | 8/2007 | Govari | A61B 8/12 600/424 |
| 2008/0238410 | A1* | 10/2008 | Charlier | G01R 33/0017 324/202 |
| 2010/0211347 | A1* | 8/2010 | Friedrich | G01R 33/0023 702/117 |
| 2011/0018533 | A1 | 1/2011 | Cesaretti et al. | |
| 2012/0086442 | A1* | 4/2012 | Haas | G01R 33/0029 324/225 |
| 2012/0182010 | A1* | 7/2012 | Lammel | G01R 33/0035 324/244 |
| 2012/0210562 | A1* | 8/2012 | Jones | G01R 35/005 29/593 |
| 2012/0274314 | A1* | 11/2012 | Cesaretti | G01R 33/0017 324/202 |
| 2013/0015843 | A1* | 1/2013 | Doogue | G01R 15/148 324/202 |
| 2013/0214774 | A1 | 8/2013 | Cesaretti et al. | |
| 2013/0300402 | A1* | 11/2013 | Liu | G01R 33/09 324/202 |
| 2013/0335066 | A1 | 12/2013 | Cesaretti et al. | |
| 2013/0335068 | A1* | 12/2013 | Dwyer | G01D 5/147 324/207.11 |
| 2014/0028290 | A1 | 1/2014 | Petrie | |
| 2014/0163911 | A1* | 6/2014 | Rohrer | G01R 33/0029 702/64 |
| 2014/0177674 | A1 | 6/2014 | Drouin et al. | |
| 2014/0264678 | A1* | 9/2014 | Liu | H01L 43/04 257/427 |
| 2014/0266176 | A1* | 9/2014 | Fernandez | G01R 1/44 324/244 |
| 2015/0022198 | A1 | 1/2015 | David et al. | |
| 2015/0176964 | A1* | 6/2015 | Uberti | G01R 33/0029 702/95 |
| 2015/0185279 | A1 | 7/2015 | Milano et al. | |
| 2015/0185284 | A1 | 7/2015 | Milano et al. | |
| 2015/0185293 | A1 | 7/2015 | Milano et al. | |
| 2015/0301149 | A1* | 10/2015 | Cesaretti | G01R 35/005 324/202 |
| 2016/0241186 | A1* | 8/2016 | Motz | G01D 3/02 |
| 2016/0252599 | A1* | 9/2016 | Motz | G01R 35/00 324/251 |
| 2017/0336481 | A1* | 11/2017 | Latham | G01R 33/077 |

OTHER PUBLICATIONS

Ian Sinclair, Abstract of Chapter 13—Microprocessors, Calculators, and Computers, Newnes, Electronics Simplified (Third Edition), 2011, obtained from https://www.sciencedirect.com/science/article/pii/B9780080970639100135 (Year: 2011).*

PCT Search Report and Written Opinion of the ISA for PCT/US2016041697 dated Oct. 12, 2016; 18 pages.

U.S. Appl. No. 14/255,166, filed Apr. 17, 2014, Cesaretti et al..

PCT International Preliminary Report dated Feb. 1, 2018 corresponding to International Application No. PCT/US2016/041697; 14 Pages.

Response to the Official Communication of Feb. 23, 2018 for European Application No. 16744988.3 as filed on Aug. 22, 2018; 17 Pages.

Response to Examination Report dated Sep. 1, 2021, filed Mar. 11, 2022 for Application No. EP16744988; 26 Pages.

European Examination Report dated Sep. 1, 2021 for European Application No. 16744988.3; 5 Pages.

Response to European Examination Report dated Sep. 1, 2021, filed Mar. 11, 2022 for European Application No. 16744988.3; 26 Pages.

* cited by examiner

Centerline Displacement
(Side View)

(Top/Bottom View)

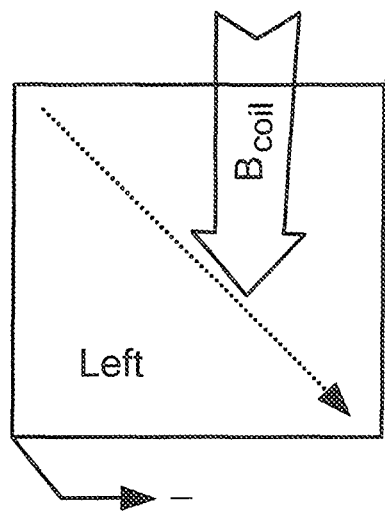
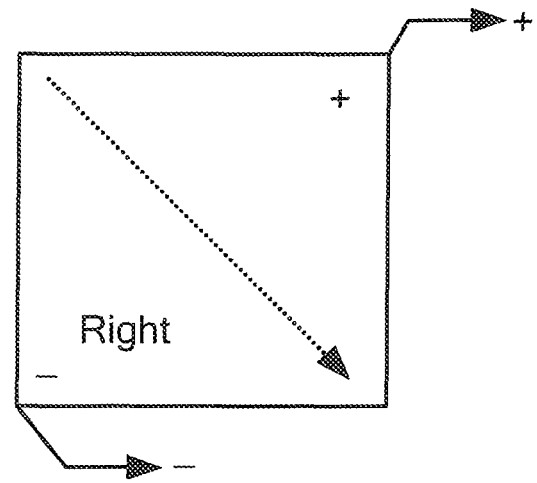
FIG. 6A  FIG. 6B
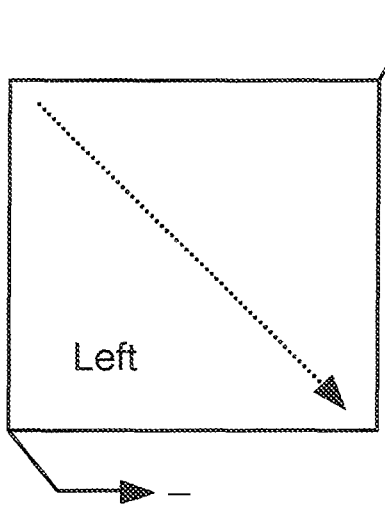
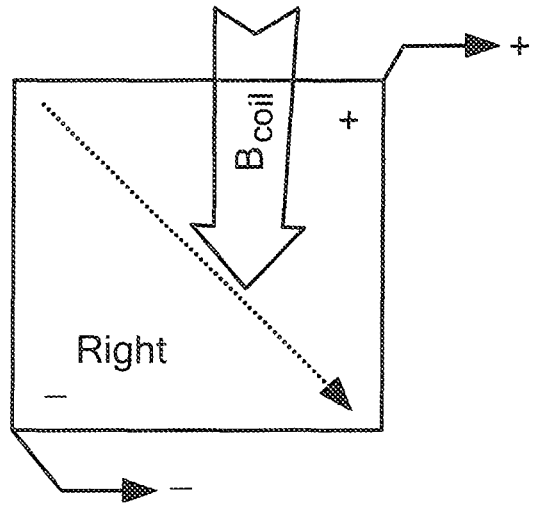
FIG. 7A  FIG. 7B

METHODS AND APPARATUS FOR TRIMMING A MAGNETIC FIELD SENSOR

BACKGROUND

As is known, there are a variety of types of magnetic field sensing elements, including, but not limited to, Hall effect elements, magnetoresistance elements, and magnetotransistors. As is also known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, i.e., circuits that use magnetic field sensing elements, are used in a variety of applications, including, but not limited to, a current sensor that senses a magnetic field generated by a current carried by a current-carrying conductor, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

Magnetic field sensors may be trimmed, such at final test, to adjust the sensitivity, for example. It can be challenging to generate accurate magnetic fields to achieve desired levels of absolute sensitivity.

SUMMARY

In one aspect of the invention, a method comprises: trimming a magnetic field sensor having a first magnetic field sensing element within an IC package, the trimming comprising using a curve for normalized sensitivity of the first magnetic field sensing element derived from first and second curves, the first curve corresponding to current through a coil in a first direction at a first time to produce a field affecting the first magnetic field sensing element versus an external field having a first polarity, and the second curve corresponding to current through the coil in a second direction opposite to the first direction at a second time to produce a field affecting the first magnetic field sensing element versus the external field having a first polarity.

The method can further include one or more of the following features: the first polarity of the external field is negative, the curve for normalized sensitivity of the first magnetic field sensing element corresponds to an average of the first and second curves, the coil is integrated with the first magnetic field sensing element, trimming comprises determining an absolute sensitivity of the magnetic field sensor in LSB per mA, trimming comprises determining an absolute sensitivity of the magnetic field sensor in LSB per Gauss, the magnetic field sensor comprises a back-biased sensor, the coil is integrated in silicon in which the magnetic field sensing element is disposed, wherein the magnetic field sensing element comprises a Hall element, and/or determining a sensitivity of the coil while no external magnetic field is applied prior to packaging the first magnetic sensing element. In one embodiment, a magnetic field sensor is trimmed in accordance with any of the features set forth above.

In a further aspect of the invention, a device comprises: a magnetic field sensor having a first magnetic field sensing element within an IC package; and a memory configured to store trimming information for the magnetic field sensor, wherein the trimming comprises using a curve for normalized sensitivity of the first magnetic field sensing element derived from first and second curves, the first curve corresponding to current through a coil in a first direction at a first time to produce a field affecting the first magnetic field sensing element versus an external field having a first polarity, and the second curve corresponding to current through the coil in a second direction opposite to the first direction at a second time to produce a field affecting the first magnetic field sensing element versus the external field having a first polarity.

The device can further include one or more of the following features: the curve for normalized sensitivity of the first magnetic field sensing element corresponds to an average of the first and second curves, the coil is integrated with the first magnetic field sensing element, and/or the magnetic field sensor comprises a back-biased sensor.

In another aspect of the invention, a method comprises: trimming a magnetic field sensor having a first magnetic field sensing element within an IC package, the trimming comprising using a curve for normalized sensitivity of the first magnetic field sensing element derived from first and second curves, the first curve corresponding to current through a coil in a first direction at a first time to produce a field affecting the first magnetic field sensing element versus an external field having a first polarity, and the second curve corresponding to current through the coil in the first direction to produce a field affecting the first magnetic field sensing element versus an external field having a second polarity.

The method can further include one or more of the following features: the curve for normalized sensitivity of the first magnetic field sensing element corresponds to an average of the first and second curves, trimming comprises determining an absolute sensitivity of the magnetic field sensor in LSB per mA, the magnetic field sensor comprises a back-biased sensor, the magnetic field sensing element comprises a Hall element, and/or determining a sensitivity of the coil while no external magnetic field is applied prior to packaging the first magnetic sensing element.

In a further aspect of the invention, a device comprises: a magnetic field sensor having a first magnetic field sensing element within an IC package; and a memory configured to store trimming information for the magnetic field sensor, wherein the trimming comprises using a curve for normalized sensitivity of the first magnetic field sensing element derived from first and second curves, the first curve corresponding to current through a coil in a first direction at a first time to produce a field affecting the first magnetic field sensing element versus an external field having a first polarity, and the second curve corresponding to current through the coil in the first direction to produce a field affecting the first magnetic field sensing element versus an the external field having a second polarity.

The device can further include one or more of the following features: the curve for normalized sensitivity of the first magnetic field sensing element corresponds to an average of the first and second curves, the coil is integrated with the first magnetic field sensing element, and/or the magnetic field sensor comprises a back-biased sensor.

In another aspect of the invention, a method comprises: trimming a magnetic field sensor having differential first and second magnetic field sensing elements spaced a given distance within an IC package, the trimming comprising using a first combined curve for normalized sensitivity of the first magnetic field sensing element derived from first and second curves, the first curve corresponding to current through a first coil in a first direction at a first time to produce a field affecting the first magnetic field sensing element versus an external field having a first polarity, and the second curve corresponding to current through the first coil in a second direction opposite to the first direction at a second time to produce a field affecting the first magnetic field sensing element versus the external field having the first polarity. The method can further include using a second combined curve for normalized sensitivity of the second magnetic field sensing element derived from third and fourth curves, the third curve corresponding to current through a second coil in a third direction at a third time to produce a field affecting the second magnetic field sensing element versus an external field having the first polarity, and the fourth curve corresponding to current through the second coil in a fourth direction opposite to the third direction at a fourth time to produce a field affecting the first magnetic field sensing element versus the external field having the first polarity. The method can further include combining the first and second combined curves, and/or the first time overlaps with at least one of the third and fourth times.

In a further aspect of the invention, a device comprises: a magnetic field sensor having differential first and second magnetic field sensing elements within an IC package; and a memory configured to store trimming information for the magnetic field sensor, wherein the trimming comprises using a first combined curve for normalized sensitivity of the first magnetic field sensing element derived from first and second curves, the first curve corresponding to current through a first coil in a first direction at a first time to produce a field affecting the first magnetic field sensing element versus an external field having a first polarity, and the second curve corresponding to current through the first coil in a second direction opposite to the first direction at a second time to produce a field affecting the first magnetic field sensing element versus the external field having the first polarity. The device can further include the memory being further configure to use a second combined curve for normalized sensitivity of the second magnetic field sensing element derived from third and fourth curves, the third curve corresponding to current through a second coil in a third direction at a third time to produce a field affecting the second magnetic field sensing element versus an external field having the first polarity, and the fourth curve corresponding, to current through the second coil in a fourth direction opposite to the third direction at a fourth time to produce a field affecting the first magnetic field sensing element versus the external field having the first polarity. The device can further include the first and second combined curves being combined. The device can further include the first time overlapping with at least one of the third and fourth times.

BRIEF DESCRIPTION OF THE DRAWINGS

The foregoing features of the invention, as well as the invention itself may be more fully understood from the following detailed description of the drawings, in which:

FIG. 6A shows a field generated by a coil for a connected sensing element and FIG. 6B shows a disconnected sensing element;

FIG. 7A shows the sensing element of FIG. 6A disconnected and FIG. 7B shows the disconnected sensing element of FIG. 6B connected;

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor.

As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit, which can be provided in an IC package, that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
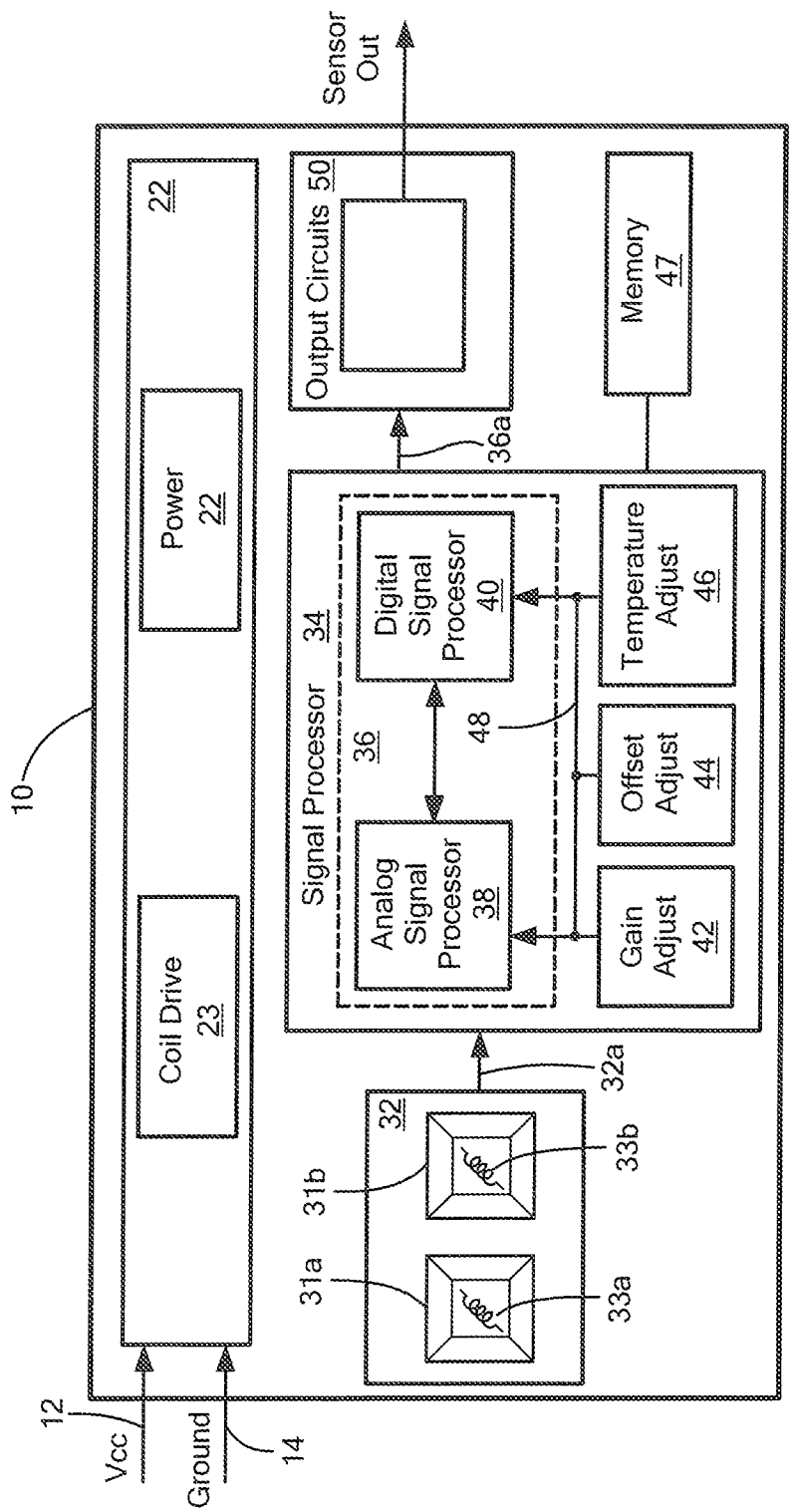
FIG. 1 is block diagram showing a magnetic field sensor trimmed in accordance with embodiments of the present invention.

FIG. 1 shows an illustrative magnetic field sensor 10 that includes a magnetic field sensing element 32 for generating a magnetic field signal 32a that can be trimmed in accordance with embodiments of the invention. In the illustrated embodiment, the magnetic field sensing element 32 includes Hall sensing elements 31a,b with integrated coils 33a,b for trimming the sensor, described more fully below. The magnetic field sensor 10 also includes a processing circuit 34 coupled to receive a signal, e.g., the signal 32a, representative of the composite magnetic field signal 32a. The processing circuit 34 is configured to generate a sensor signal 36a.

The magnetic field sensor 10 can include a power circuit 22 coupled to Vcc 12 and ground 14 and a coil drive circuit 23 to energize the coils 33a,b. In other embodiments, an external coil driver module, apart from the integrated circuit 10 can be used. Also, the coils 33 can be integrated with the magnetic sensing element or can be external to the sensor 10.

The processing circuit 34 (also referred to herein as a signal processor 34) can include a processing module 36 having either an analog signal processor 38, a digital signal processor 40, or any combination of analog and digital processors 38, 40 that perform any combination of analog and digital processing of the magnetic field signal 32a. The arrow shown between the analog signal processor 38 and the digital signal processor 40 is used merely to indicate the combination of analog and digital signal processing and various couplings therebetween.

The signal processor 34 can also include a gain adjustment module 42, an offset adjustment module 44, and a temperature adjustment module 46, each coupled to the processing module 36. The gain adjustment module 42 is configured to contribute to a signal 48 received by the processing module 36, which signal 48 is configured to adjust or calibrate a gain of the processing module 36. The offset adjustment module 44 is also configured to contribute to the signal 48 received by the processing module 36, which signal 48 is also configured to adjust or calibrate a DC offset of the processing module 36. The temperature adjustment module 46 is also configured to contribute to the signal 48 received by the processing module 36, which signal 48 is configured to adjust or calibrate a gain and/or a DC offset of the processing module 36 over temperature excursions. The gain can be adjusted during the trimming process, as described more fully below. In some embodiments, the magnetic field sensor 10 can also include an output circuit 50 providing a sensor output signal from the output 36a of the signal processor 34.

The sensor 10 can further include memory 47 which can be provided by PROM, fuses, RAM, NVRAM, solid state devices, etc. In one embodiment, the memory 47 is provided on board the sensor 10. The memory 47 can store various information, such as trim settings and parameters described below.

Embodiments of the invention provide an integrated test solution to measure and trim the sensitivity of a magnetic sensor using current flow in coils for affecting magnetic field sensing elements, such as Hall elements, using a H-bridge coil driver, for example. Embodiments of the invention are useful for differential magnetic sensors with an integrated rare earth pellet, for example. In addition, current in the coil can be provided by an external pin as well as an integrated circuit. Coils can be integrated in the sensor substrate, e.g., silicon, or externally.

Figure 2:
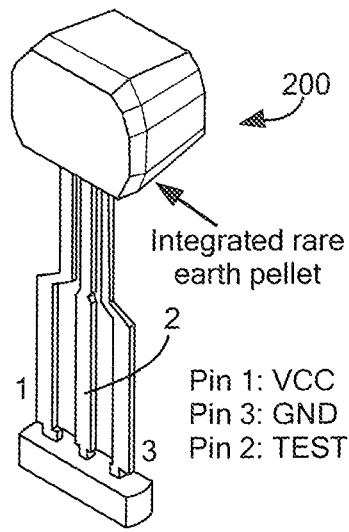
FIG. 2 shows an illustrative magnetic field sensor n a IC package having three leads.
Figure 2B:
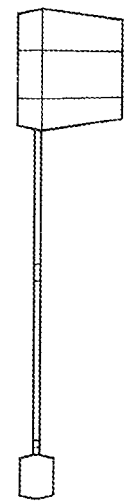
FIG. 2B shows a side view.
Figure 2A:
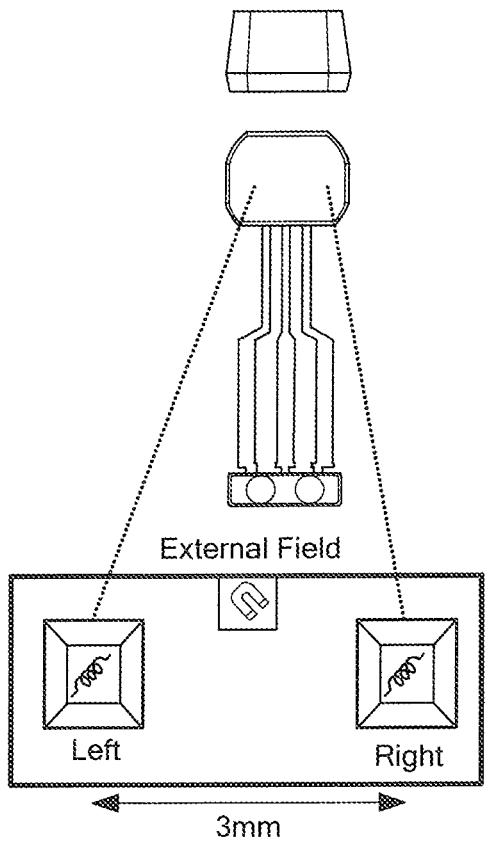
FIG. 2A shows a side view.
Figure 2C:
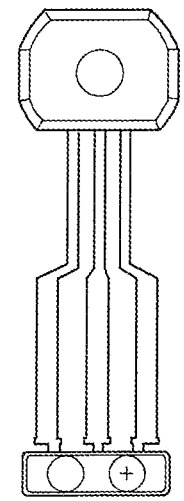
FIG. 2C shows a back view of the IC package of FIG. 2.

FIG. 2 shows a magnetic sensor integrated circuit (IC) 200 including an integrated rare earth pellet and first and second Hall elements (shown as Left and Right) separated by a distance of 3 mm, for example, as shown in a front, side, and back view, respectively in FIGS. 2A-C with illustrative dimensions. The magnetic sensor 200 includes a Vcc pin, a ground pin, and an output/test pin. In general, the magnetic field sensor can include any practical number, including one, of magnetic field sensing elements, which can be separated by any practical distance to meet the needs of a particular application. It will be readily understood that the Hall element spacing can impact the trimming process. In addition, it further understood that the magnetic sensor can comprise any practical type of sensing element, such as Hall elements in any useful configuration, including dual, quad, and other configurations.

Figure 3A:
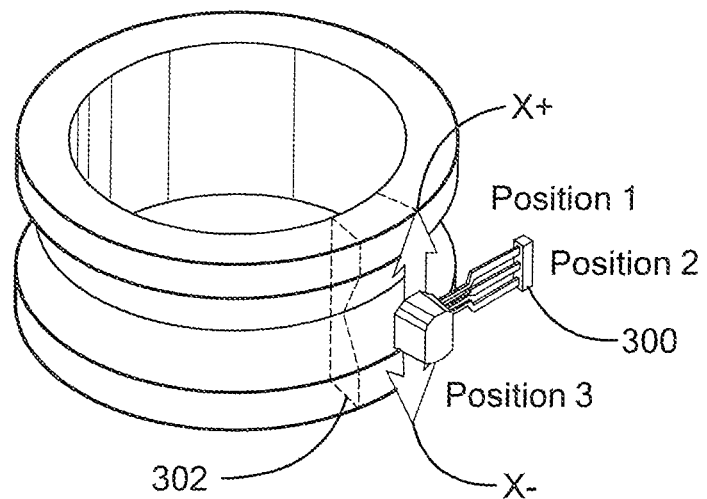
FIG. 3A shows a magnetic field sensor proximate a target.
Figure 3B:
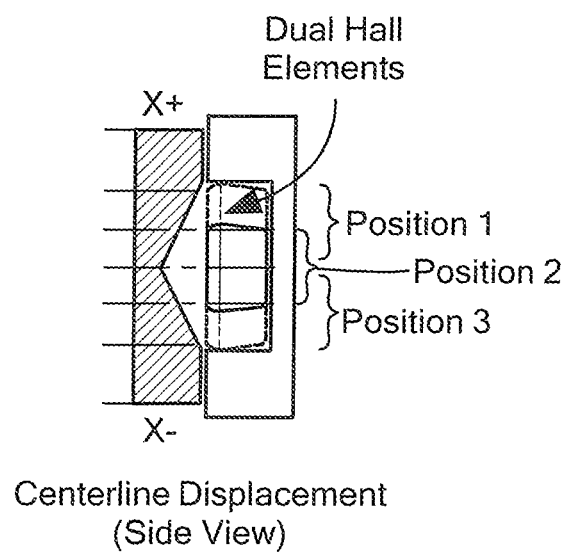
FIG. 3B shows a side view of the sensor/target of FIG. 3A.
Figure 3C:
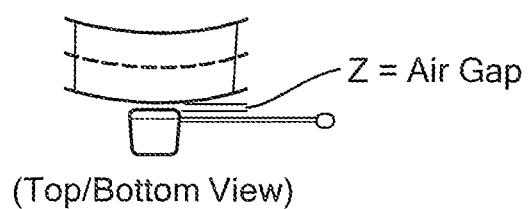
FIG. 3C shows a bottom view of the sensor/target of FIG. 3A.

FIGS. 3A-C show magnetic sensor 300 in spaced relation to a ferromagnetic metal target 302 that moves with respect to the sensor so as to perturb the magnetic field across first and second Hall elements in the sensor. FIG. 3B shows the sensor having position 1, position 2, and position 3 defined by a displacement from a centerline of a groove in the target. As will be readily apparent, the position of the sensor 300 in relation to the target impacts the differential signal generated by the dual Hall elements. As shown in FIG. 3C, the sensor 300 is separated from the target by an air gap. The Hall elements sense the difference in the magnetic field which is processed to provide information on movement of the target.

In the illustrated embodiment, the sensor 300 operates as a differential magnetic field sensor.

One challenge for such sensors is trimming sensitivity (absolute gain) of the signal path in the production test. To trim or measure the sensitivity of the sensor, an accurate differential field may need to be generated across the Hall elements.

It would be desirable to create a differential field of 4% or better accuracy, for example, across the Hall elements separated by about 3 mm, for example. However, at present it may not be possible or cost effective to achieve such accuracy. It may be that a sensitivity of 4% cannot be guaranteed without an absolute sensitivity trim better than 4%. Moreover, a given part is likely to have additional errors while trimming the sensitivity temperature coefficient.

In general, ferromagnetic structures cannot be used in the production test since it is difficult to control the air-gap to the needed accuracy. Even if a ferromagnetic target is used, the sensor may have a relatively low bandwidth (e.g., 3 dB bandwidth has a selectable range from about 188 Hz to about 3 KHz) that may consume an excessive amount of available test time.

Figure 3D:
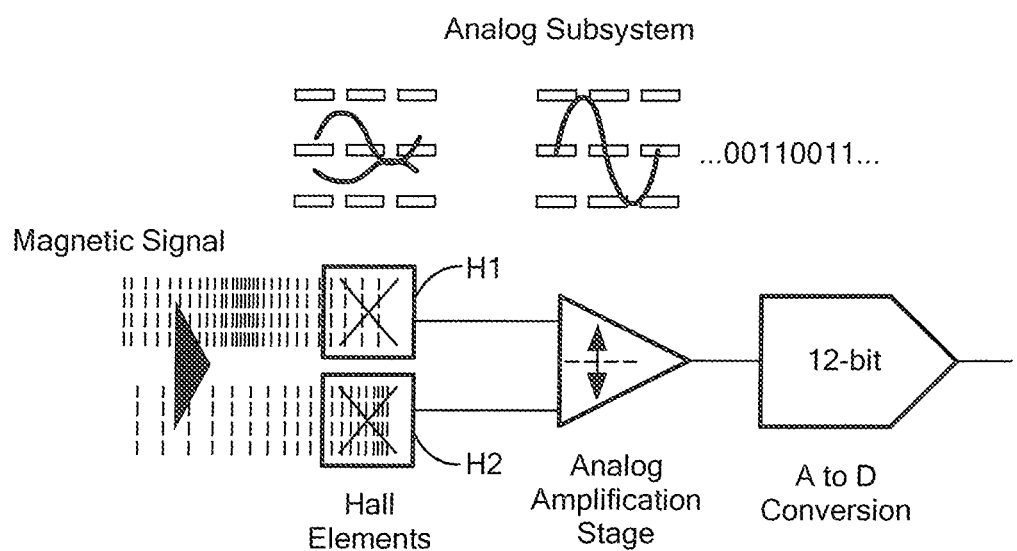
FIG. 3D shows an analog subsystem of an illustrative magnetic field sensor.

FIG. 3D shows a subsystem of the signal path represented in a simplified block diagram of an illustrative magnetic field sensor. A magnetic signal is provided to the first and second Hall elements H1, H2, which provide a differential output to an analog amplification stage. The amplified signal is then digitized by analog-to-digital conversion.

This architecture cancels out most of the common mode field present over the left and right hail plates H1, H2 and senses only the differential field. It should be noted that any mismatch present between the left and the right hall plate sensitivity or similar systematic mismatch causes a residual offset in the final output. This can also alter the effective differential gain of the sensor. This may be acceptable since the trimming process can account for such offsets. In addition, in this case, a front end amplifier and Hall plate signals are chopped in illustrative embodiments so most of the offset from the common signal path is eliminated.

Figure 4A:
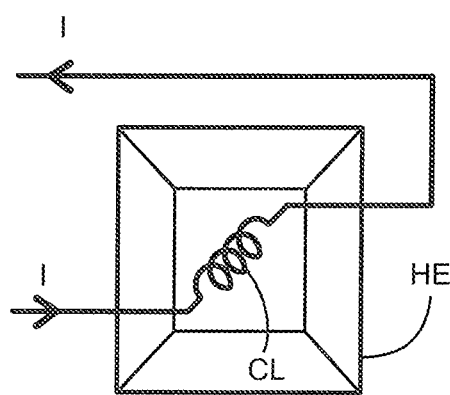
FIG. 4A shows a magnetic field sensing element with an integrate coil.
Figure 4B:
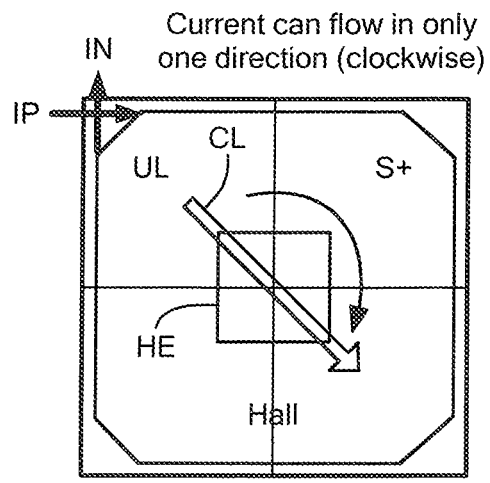
FIG. 4B shows current flow in the coil of FIG. 4A.

It was previously believed that external test equipment limitations could be overcome by integrating coils CL on the top of hall elements HE and driving them with a known current I through an external test pin, as shown in FIGS. 4A, B. In the illustrated embodiment, current flows in a clockwise direction in FIG. 4B. It was believed that this arrangement created an additive/subtractive magnetic field on the top of back bias field due to a rare earth pellet, for example.

However, this arrangement was restricted to current flow in only one direction, which was perceived to be good because effective sensitivity or effective figure of merit of the integrated coils ($S_{coil}$) could be calibrated during a probe test, which refers to probe of a die and integrated coils prior to packaging the die. Also, it was believed that for a current in the coil $I_{coil}$ and a perpendicular component of the field $B_{ext}$ into the hall plate due to rare earth pellet, then the total field seen by the hall elements could be determined as:

$$B_{tot}=B_{coil}+B_{ext} \quad (1)$$

where $B_{coil}$ is the effective field generated by the coil over the hall element such that $$B_{coil}=S_{coil}*I_{coil} \quad (2)$$

In other words, the sensor ($S_{gauss}$) sensitivity can be trimmed using $$S_{gauss}=S_{coil}/\{d(V_{out})/d(I_{coil})\} \quad (3)$$

where $V_{out}$ is the output of the sensor.

Figure 5A:
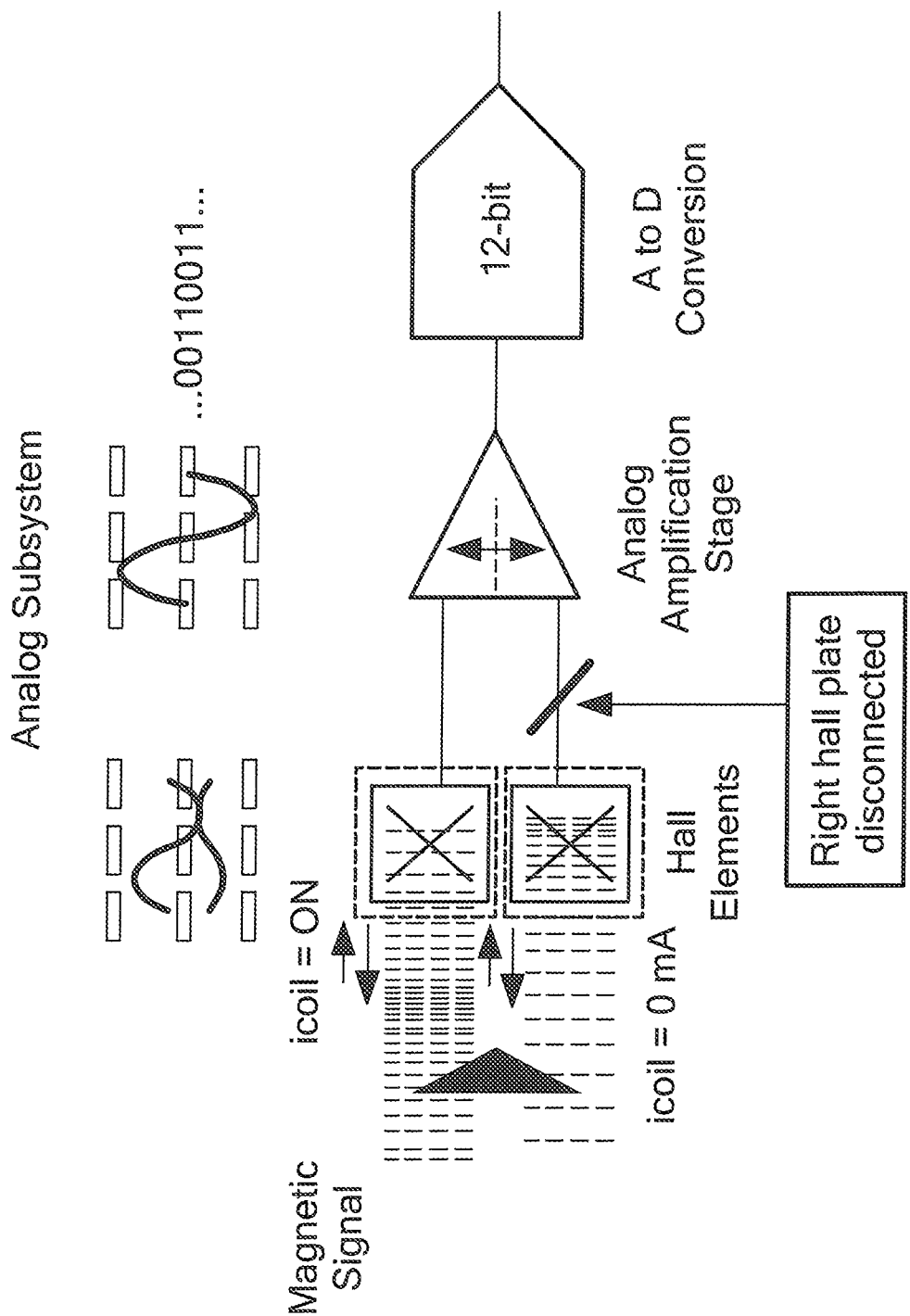
FIG. 5A shows a magnetic field sensor having one magnetic field sensing element disconnected.

FIGS. 5A, B in conjunction with the following shows how $S_{coil}$ can be determined at the probe test during which no external/background field $B_{ext}$ is present.

Figure 5B:
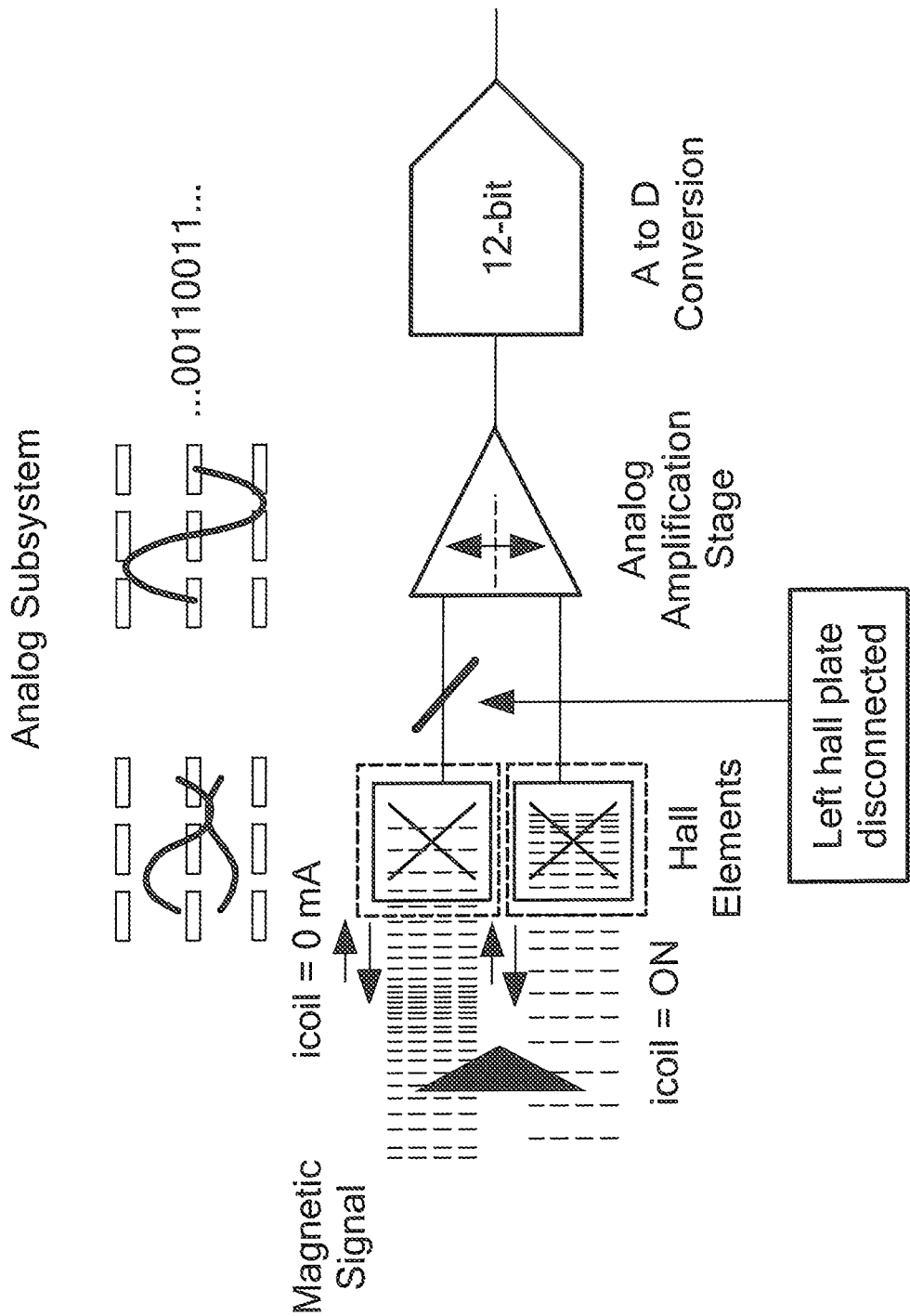
FIG. 5B shows a magnetic field sensor having a different magnetic field sensing element disconnected.

1. At probe test, $B_{ext}$=0 G.
2. In a test-mode, the left (FIG. 5B) or right hall plate (FIG. 5A) is disconnected from the sensor signal path which causes the sensor to act like a single ended sensor.
3. Sensor output is measured for each of the configurations as shown. This gives the sensitivity of the sensor in terms of $d(V_{out})/d(I_{coil})$. Here, unit of the sensitivity would be [LSB/mA] and/or [V/mA].
4. The above process is performed with different configurations, as shown in FIGS. 6A, B. With the right hall plate disconnected, the left hall plate coil is energized to create $B_{coil}$. As shown in FIG. 7A, B, with the left hall plate disconnected, the right hall plate coil is energized to create $B_{coil}$ for the righty hall element, as shown.
5. From the above, the individual sensitivity of the left and right channels in terms of [LSB/mA] can be determined.
6. The LSB/G sensitivity of the left and the right channel can then be determined at the probe test with a setup where uniform magnetic field is applied while the left or right hall plate is disconnected from the signal path. The [LSB/G] for the left and right channel can be determined. Note that, during this time one of the hall plates will be disconnected which may not be possible in the final test as the part may be subject to large background fields that can saturate the front end.

This should not be confused with the limitations discussed above relating to the production of accurate differential magnetic fields. One can produce accurate uniform magnetic fields and with the configuration of FIGS. 5A, B where one of the hall plates is disconnected from the main signal path and one can measure left or right hall path gains as long as applied magnetic field is small enough so that front end does not saturate.

7. From the above, the [G/mA] sensitivities $S_{coil\_L}$ and $S_{coil\_R}$ of the left and the right coils respectively can be determined when no external field is present. $S_{coil}$ values can be stored in memory of the sensor, such as memory 47 in FIG. 1, for example.

It should be noted that an assumption for the above was that $S_{coil}$ is independent of the external magnetic field present over the hall element. However, this assumption has been found to be incorrect.

Figure 8:
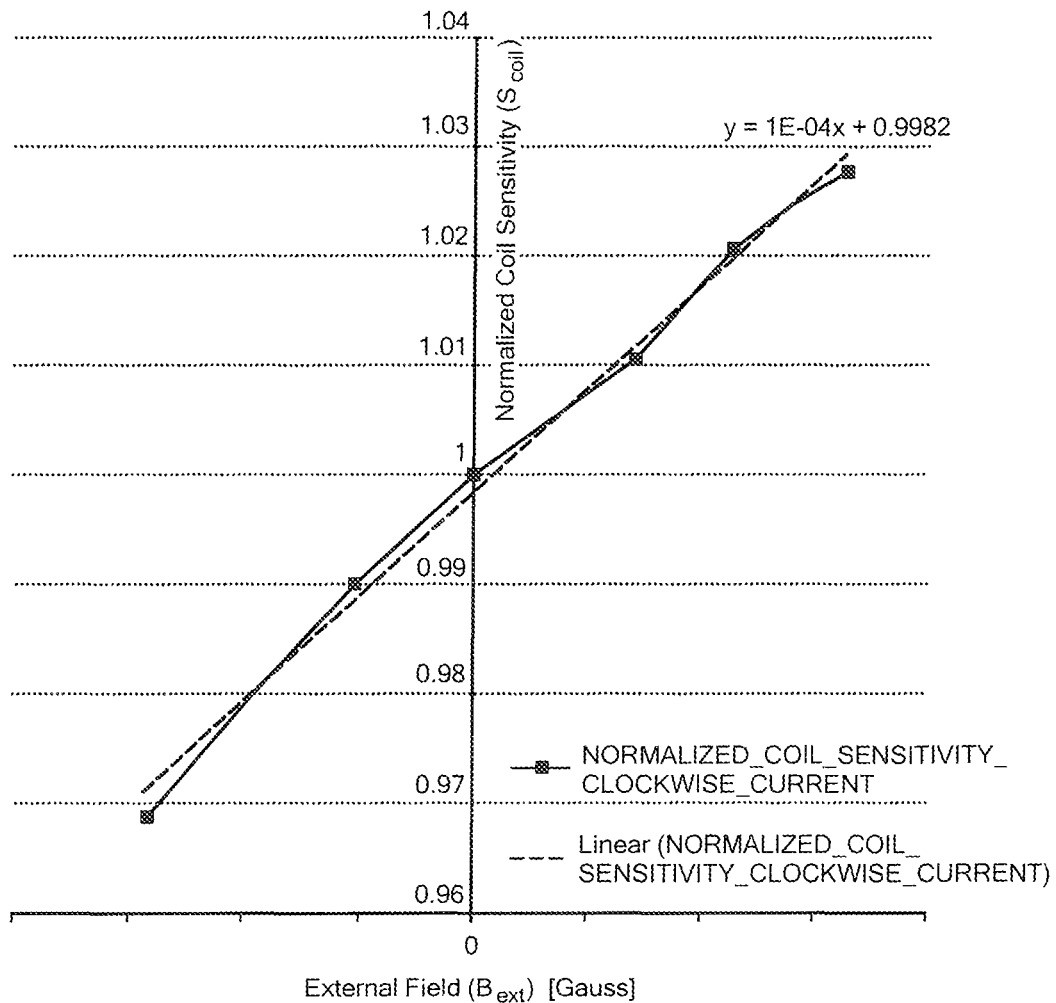
FIG. 8 shows a graphical representation of normalized coil sensitivity versus external field for unidirectional current flow.

FIG. 8 shows a plot measured using an illustrative magnetic sensor with normalized coil sensitivity as a function of the external field. Note that $S_{coil}$ varies with $B_{ext}$. This dependency result shows $B_{coil}$ being a function of the external field:

$$B_{coil}=[S_{coil\_0}*I_{coil}]*f(B_{ext}) \quad (4),$$

where $S_{coil\_0}$ represents the coil sensitivity determined from the above, e.g., probe test, when $B_{ext}$=0 G.

Figure 9:
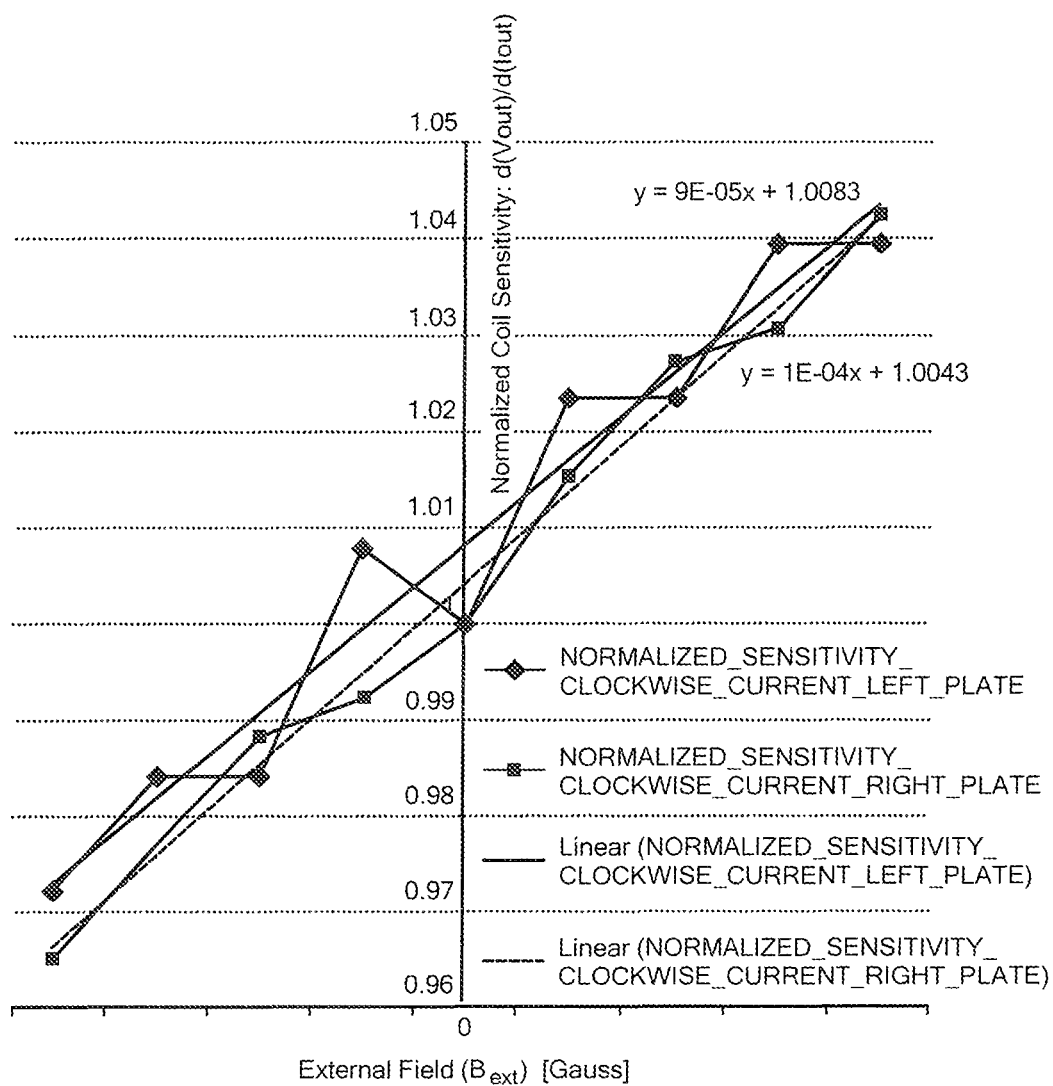
FIG. 9 shows a graphical representation of a change in output voltage over change in coil current for a varying external field for left and right sensing elements.

Measuring the sensitivity of the part $[d(V_{out})/d(I_{coil})]$ results in the plot shown in FIG. 9 which is similar to the plot shown in FIG. 8. FIG. 9 shows left hall plate and right hall plate sensitivity for a varying external field.

As can be seen, the correlation between the effective differential magnetic field applied by the coils and the back-bias/external magnetic field results in an error with the sensitivity measurement. The end result is perceived as a shift of the sensor sensitivity with the external magnetic field. As this is an artifact of the coils, the sensitivity shift is not actual, and therefore, impacts both absolute sensitivity trim and temperature coefficient trim.

From the above, it can be seen that there is false perception of the sensor sensitivity drift due to changes in the external field so that in the final package, a back-bias field will vary over temperature and cause more errors in the actual sensitivity measurement. In addition, one cannot distinguish between the actual sensitivity temperature drift and the measurement error due to the back-bias field variations.

Figure 10A:
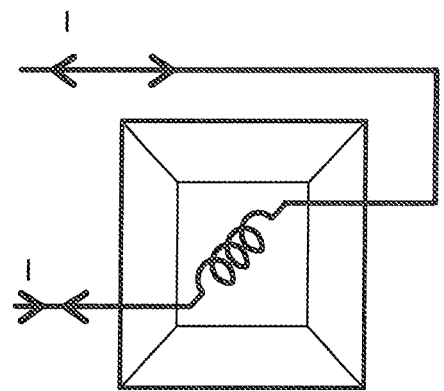
FIGS. 10A and 10B show a sensing element and integrated coil with bidirectional current flow.
Figure 10B:
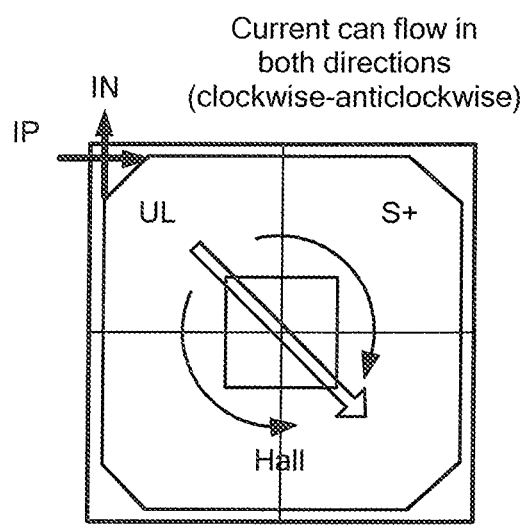

In one aspect of the invention, currents are directed through the coils integrated with the Hall elements in one direction at one time and the opposite direction at a different time to enhance the trimming process, as shown in FIGS. 10A, B. That is, during a first period of time current flows though a coil in a first direction and during a second period of time current flows through the coil in the opposite direction.

Figure 11:
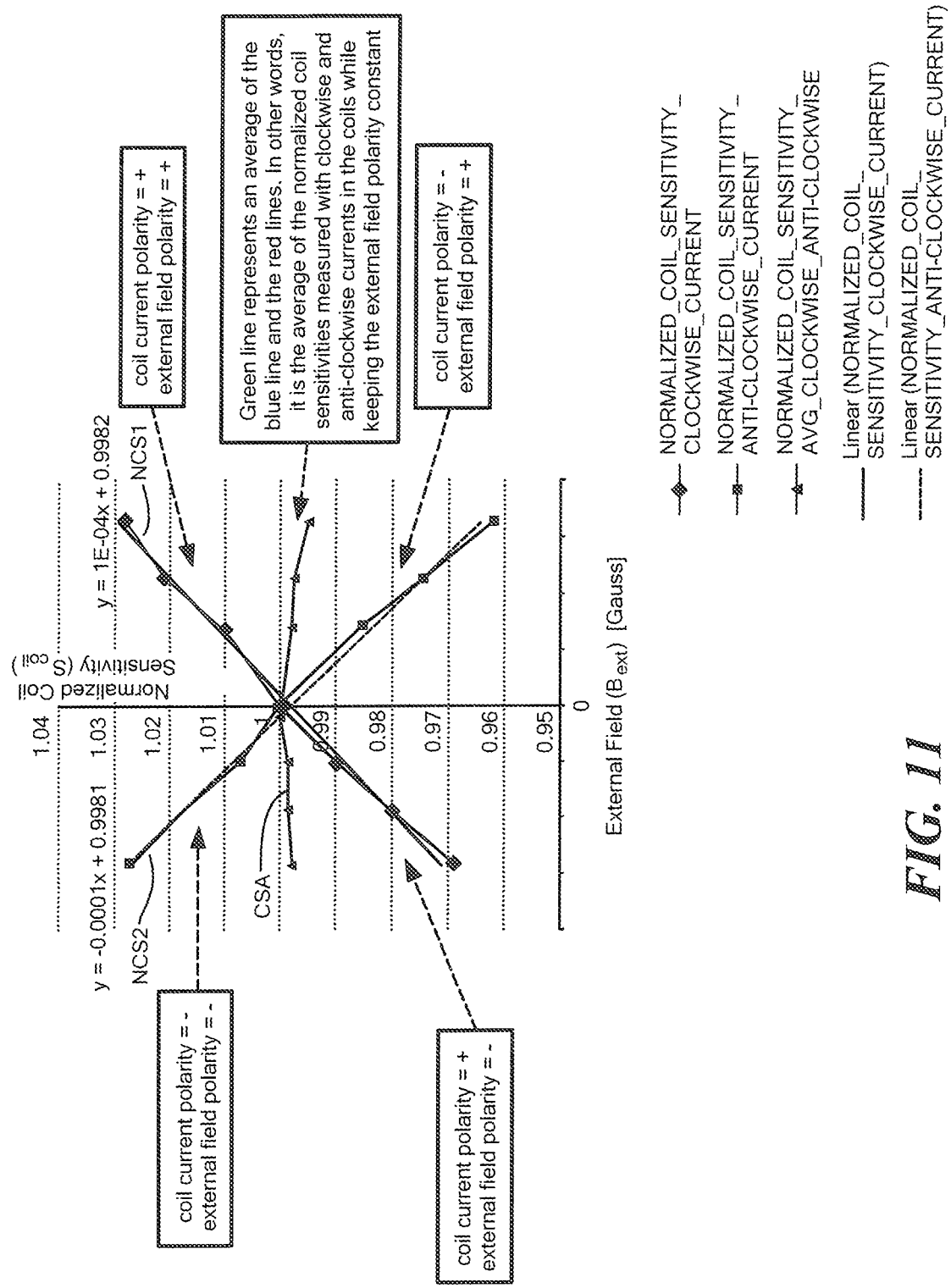
FIG. 11 is a graphical representation of normalized coil sensitivity versus external field for opposite coil current flows and opposite external field polarities along the curves combined for the two opposite current flows and external field polarities.

The results from current flow in the multiple directions show a phenomenon in which the effect of the external field on the effective coil sensitivity is dependent on the relative polarity of the current in the coils and the external field polarity over the hall elements. This effect can be compensated for by measuring the coil sensitivity by driving the current into the coils with opposite polarities, as shown in FIG. 11.

For current in a first direction or polarity (+) through the integrated coil, where the external field varies from minus to plus, a first normalized coil sensitivity NCS1 varies generally linearly from a lower left to a top right. For current in a second direction or polarity (−), wherein the external field varies from plus to minus, a second normalized coil sensitivity NCS2 varies from a top left to a lower right. A plot CSA of the combined coil sensitivity of clockwise and anti-clockwise currents has a relatively constant sensitivity. In embodiments, the first and second normalized coil sensitivities NCS1, NCS2, are averaged to generate the substantially constant combined coil sensitivity CSA. The absolute sensitivity of the magnetic sensor can be measured and trimmed with greater accuracy (within 1%) by using the averaged coil sensitivity CSA which is consistent over changes in the external field.

While 400G is an illustrative limit, it is understood that higher values can be used up to at least 1400 G, for example. It should be noted that while the signal-to-noise ratio (SNR) may have limitations, a better than 1% trim absolute accuracy is achievable. In addition, while curves NCS1, NCS2 are shown as substantially linear, in other embodiments these curves are not linear but combine to generate a generally constant normalized coil sensitivity. It is understood that as used herein a curve comprises two or more points. It should be further noted that $S_{gauss}$ is constant at a given temperature. So, from equation (3) above, it follows that coil sensitivity $S_{coil}$) corresponds ($\alpha$) to a change in output voltage $V_{out}$ over change in coil current $I_{coil}$:

$$S_{coil} \alpha \{d(V_{out})/d(I_{coil})\} \quad (5)$$

Still referring to FIG. 11, it should be noted that the coil sensitivity CSA can be generated in a variety of ways including from portions of the first and/or second normalized coil sensitivities NCS1, NCS2. In one embodiment, a combined coil sensitivity CSA is determined for an external field ranging from about 0 to about 400 G, or some portion thereof, which is a positive polarity, e.g., the right half of FIG. 11. The first and second normalized coil sensitivities NCS1. NCS2 for an external field greater than 0 G can be combined to determine the constant combined coil sensitivity CSA, which can be extended into a negative polarity for external field. In one embodiment, one point from a first curve and one point from a second curve can be combined to determine the combined coil sensitivity CSA.

Figure 11A:
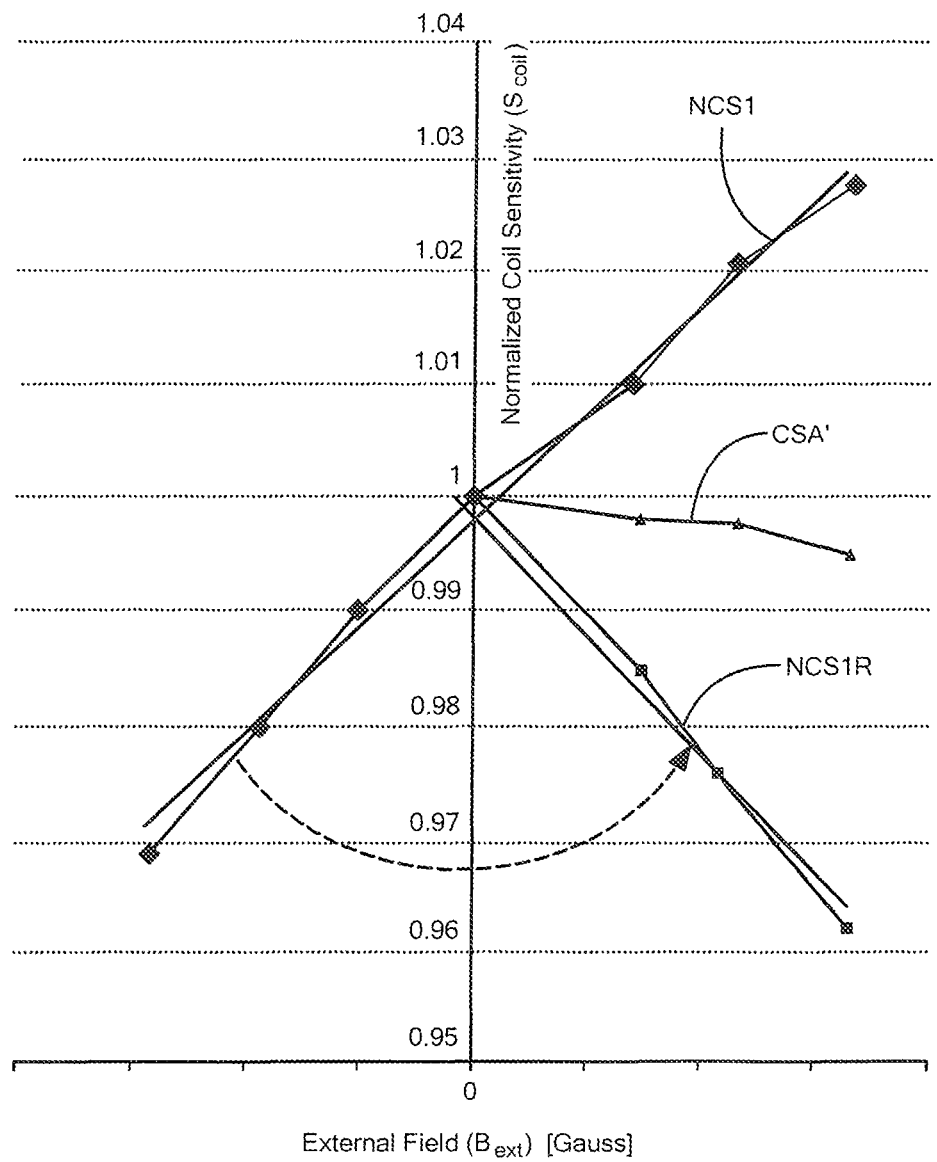
FIG. 11A is a graphical representation of normalized coil sensitivity for a coil current in a first direction and rotated about an axis.

In another embodiment, only one of the first and second normalized coil sensitivities NCS1, NCS2, is used to generate the combined coil sensitivity CSA. For example, the first normalized coil sensitivity NCS1 has a first coil current polarity. The coil sensitivity NCS1 extends over positive and negative polarities of the external field, such as from about −300 G to about +300 G. As shown in FIG. 11A, if one takes the absolute value of the external field for the first normalized coil sensitivity NCS1 to rotate the portion of the curve NCS1 for a negative polarity of the external field about the y-axis, the rotated NCS1R and non-rotated portions of NCS1 (positive external field portion) can be combined to generate a substantially constant combined coil sensitivity CSA'. Thus, NCS1 has a first polarity and NCS1R has a second field polarity. The second normalized coil sensitivity NCS2 can be similarly rotated to generate CSA'.

Figure 12:
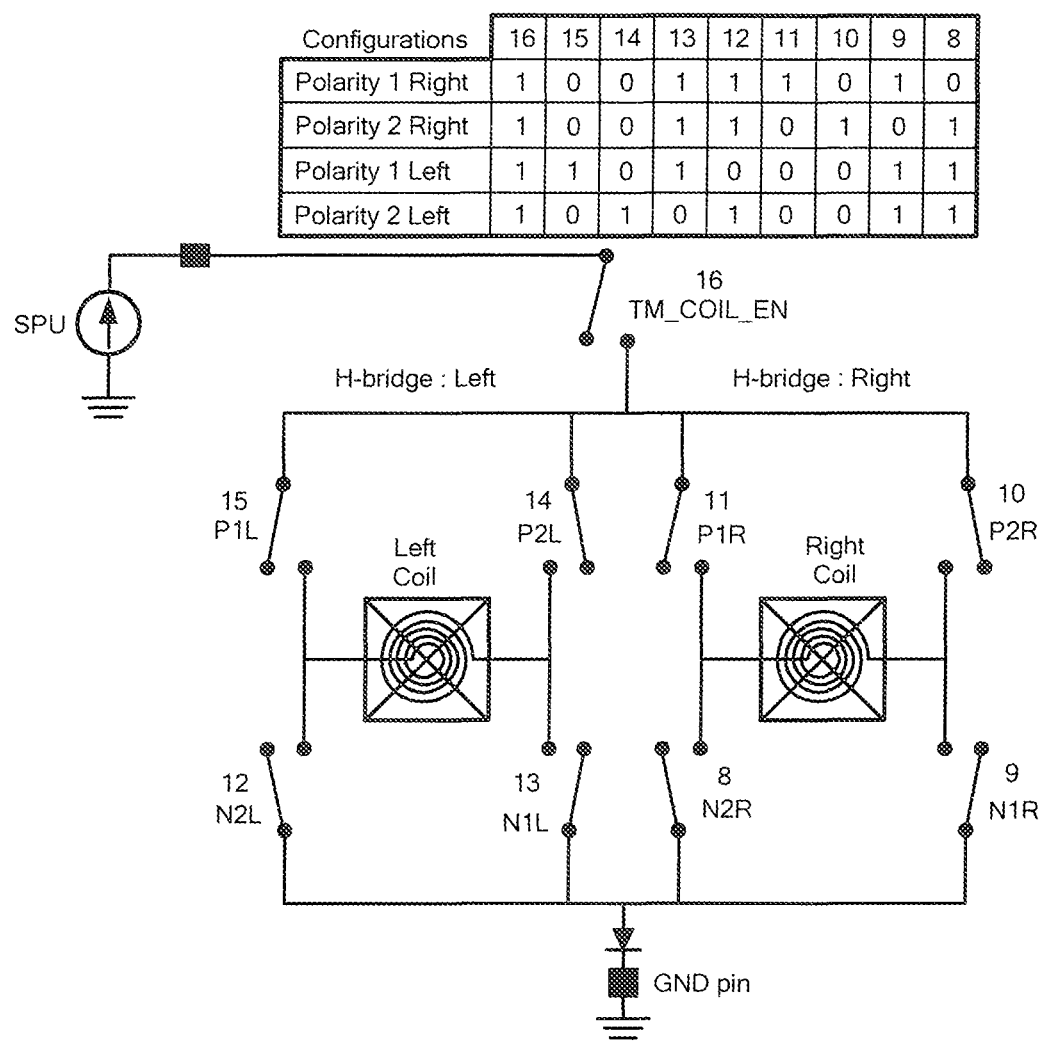
FIG. 12 is a schematic representation of an illustrative trimming process.

Thus, the combined or average coil sensitivity CSA from FIG. 11 can represent $d(V_{out})/d(_{coil})$ on the Y-axis in a normalized form for which an illustrative trim process is shown in FIG. 12. A series of switches are coupled around a first (left) coil LC integrated with a first (left) Hall element and a second (right) coil LC integrated with a second (right) Hall element. A coil enable CE switch enables current from a current source SKI to flow to the first and second coils. As can be seen, switches N2L, N1L, N2R, and N1R having one terminal coupled to ground and another terminal selectively coupled to one of the left or right coils LC, RC, as shown. Switches P1L, P2L, P1R, P2R have one terminal coupled to the current source SPU and another terminal selectively coupled to the left or right coil. As can be seen, the switches can be controlled to enable current flow in a first direction through the first and second coils during a first period of time and current flow in the opposite direction during a second period of time.

With this arrangement, an illustrative trimming process includes directional current flow in the coils, which are integrated with the sensing elements, to determine the gain of the sensor. One embodiment is described below for performing sensor trim during final test of the sensor. During the final test, the sensor is packaged with the rare earth pellet so $B_{ext} \neq 0$ G. It is understood that $B_{ext}$ can be provided in any suitable value. In embodiment, $B_{ext}$ can range up to at least about 1400 G.

Figure 13A:
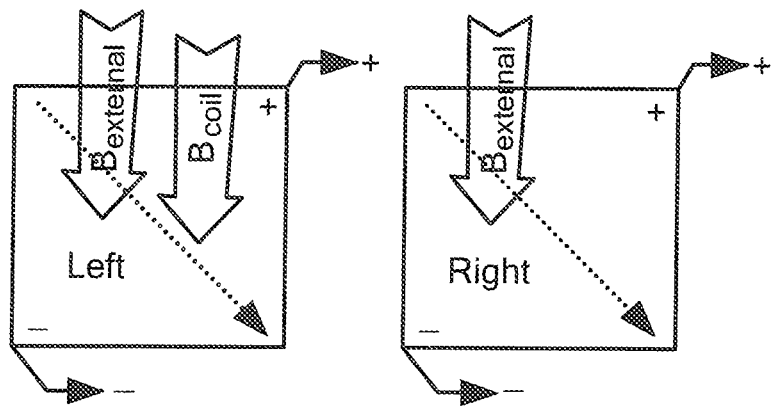
FIGS. 13A-D show illustrative left and right coil and sensing element configurations to determine actual sensor sensitivity.
Figure 13B:
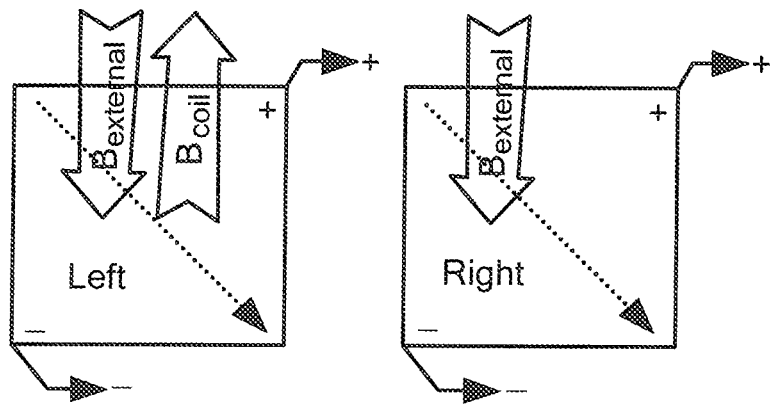

As shown in FIGS. 13A, B, the left Hall coils have current flow and the right Hall coils are disconnected. An external field $B_{external}$ is present due to the rare earth pellet. In FIG. 13A current flows in a first direction to create a field $B_{coil}$ in a first orientation. In FIG. 13B, the current flows in the opposite direction thought the left coil to create a field $B_{coil}$ in the opposite orientation as that of FIG. 13A.

Figure 13C:
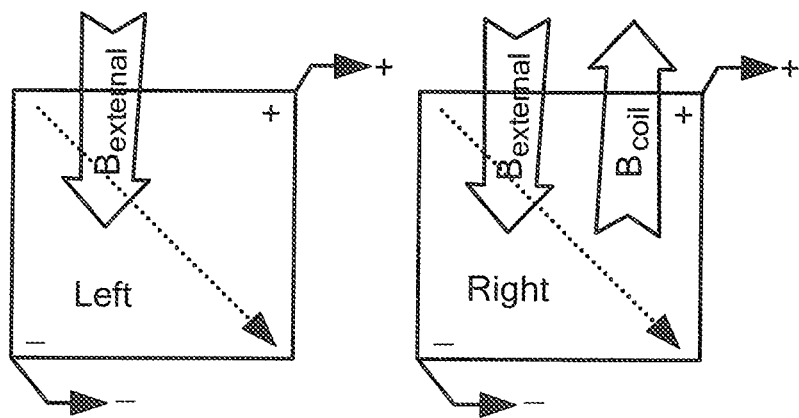
Figure 13D:
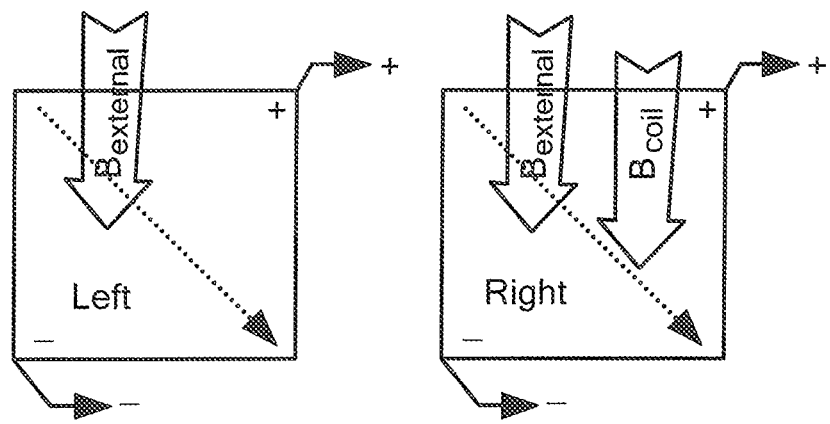

As shown in FIGS. 13C, D, a similar process is performed for the right coil while the left hall is disconnected. Current is driven through the right coil in one direction to create external field $B_{external}$ in one orientation (FIG. 13C) which is reversed by current flow in the opposite direction (FIG. 13D). The process to measure $S_{coil}$ is still valid from probe test as $B_{ext}=0$ G. $S_{coil\_0}$ is measured for both left and the right coil and used in the final packaged part test flow as described below.

The sensor output is measured for each of the configurations shown in FIGS. 13A-D to determine sensitivity of the sensor in terms of $d(V_{out})/d(I_{coil})$. Here, unit of the sensitivity would be [LSB/mA]. Sensor output is measured while the current in the coils is steered with one polarity for the one set and another polarity for the second set for a total of four values of $d(V_{out})/d(I_{coil})$. Two values will correspond to left coils with two polarities and similarly two values for right coils with two polarities.

From the above, the actual sensitivity of the part that is $S_{gauss}$ in [LSB/G] can be determined by:

$$Sgauss\_L = \frac{\frac{Scoil\_L\_0}{\{d(Vout)/d(Icoil\_L+)\}} + \frac{Scoil\_L\_0}{\{d(Vout)/d(Icoil\_L-)\}}}{2}$$

$$Sgauss\_R = \frac{\frac{Scoil\_R\_0}{\{d(Vout)/d(Icoil\_R+)\}} + \frac{Scoil\_R\_0}{\{d(Vout)/d(Icoil\_R-)\}}}{2}$$

$$Sgauss\_avg = \frac{Sgauss\_L + Sgauss\_R}{2}$$

Icoil+ represents one polarity of the current (clockwise) and Icoil− represents the opposite polarity (anti-clockwise). L indicates left and R indicates right. It understood that as used herein left and right are relative terms and should be construed broadly to mean first and second elements spaced from each other at some distance.

In another embodiment, referring again to FIG. 12, first and second (e.g., left and right) coils can be turned on at the same time such that the left and the right coils have the current in the opposite direction at a given point. The currents counter each other from which average coil sensitivity can be determined.

Figure 13E:
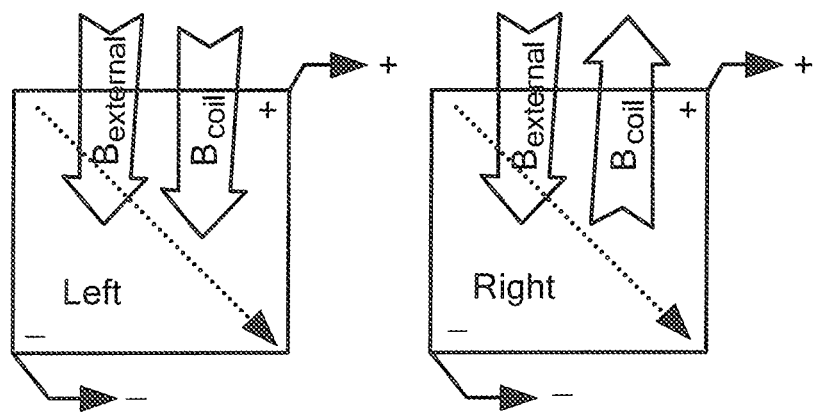
FIGS. 13E, F show illustrative left and right coil and sensing elements configurations for direct sensor sensitivity determination.
Figure 13F:
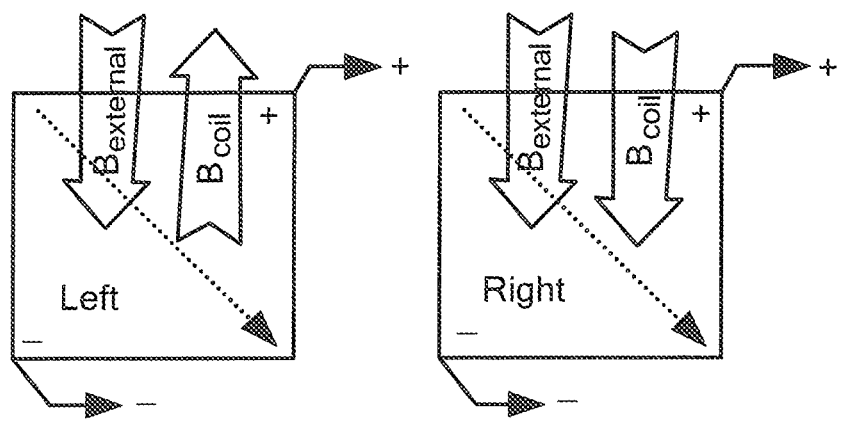

The configurations shown in FIGS. 13E and 13F create a direct averaging effect which resembles the averaging of the first and second curves NCS1, NCS2 of FIG. 11 to yield the curve CSA (FIG. 11). Thus, a combined coil sensitivity CSA (FIG. 11) can be directly determined. It is understood that the orientation of the arrow of $B_{coil}$ corresponds to current direction. FIG. 13E can be considered polarity 1 left combined with polarity 2 right and FIG. 13F can be considered polarity 2 left combined with polarity 1 right.

It is understood that for a single test pin to drive the current externally, current is divided between the left and the right coils. If the coils are not perfectly matched to each other, current will not divide equally possibly affecting trim accuracy. Where larger trim errors are acceptable, this technique may be suitable.

Figure 14A:
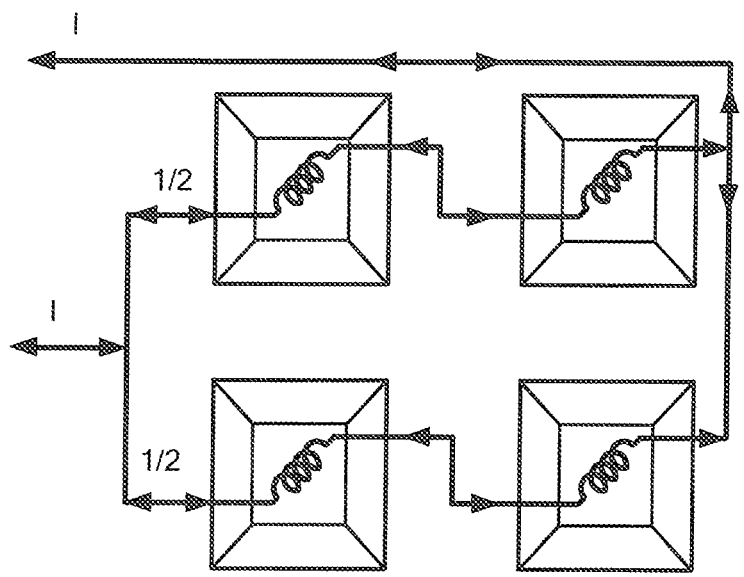
FIG. 14A shows a first configuration for coil current flow and FIG. 14B shows a second configuration for coil current flow.
Figure 14B:
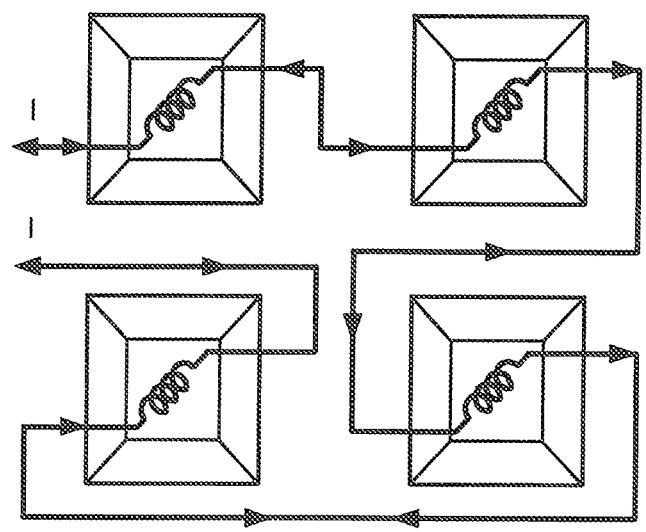

In general, the sensor elements can be provided in any suitable configuration, such as single, dual, quad and other configurations. FIGS. 14A, B show illustrative current flow configurations through quad Hall elements. As can be seen, in FIG. 14A, current is split between elements, while in FIG. 14B current flow is serial through the elements.

Embodiments of the invention provide a production test solution to provide highly accurate back-biased sensor. Sensitivity temperature coefficients can be trimmed with greater accuracy using a process that is low cost and fast. While embodiments are shown having a differential sensor configuration, it is understood that embodiments of the invention are applicable to single ended sensors as well. It is further understood that embodiments of the invention are applicable to back-biased and non-back-biased sensors.

Figure 15:
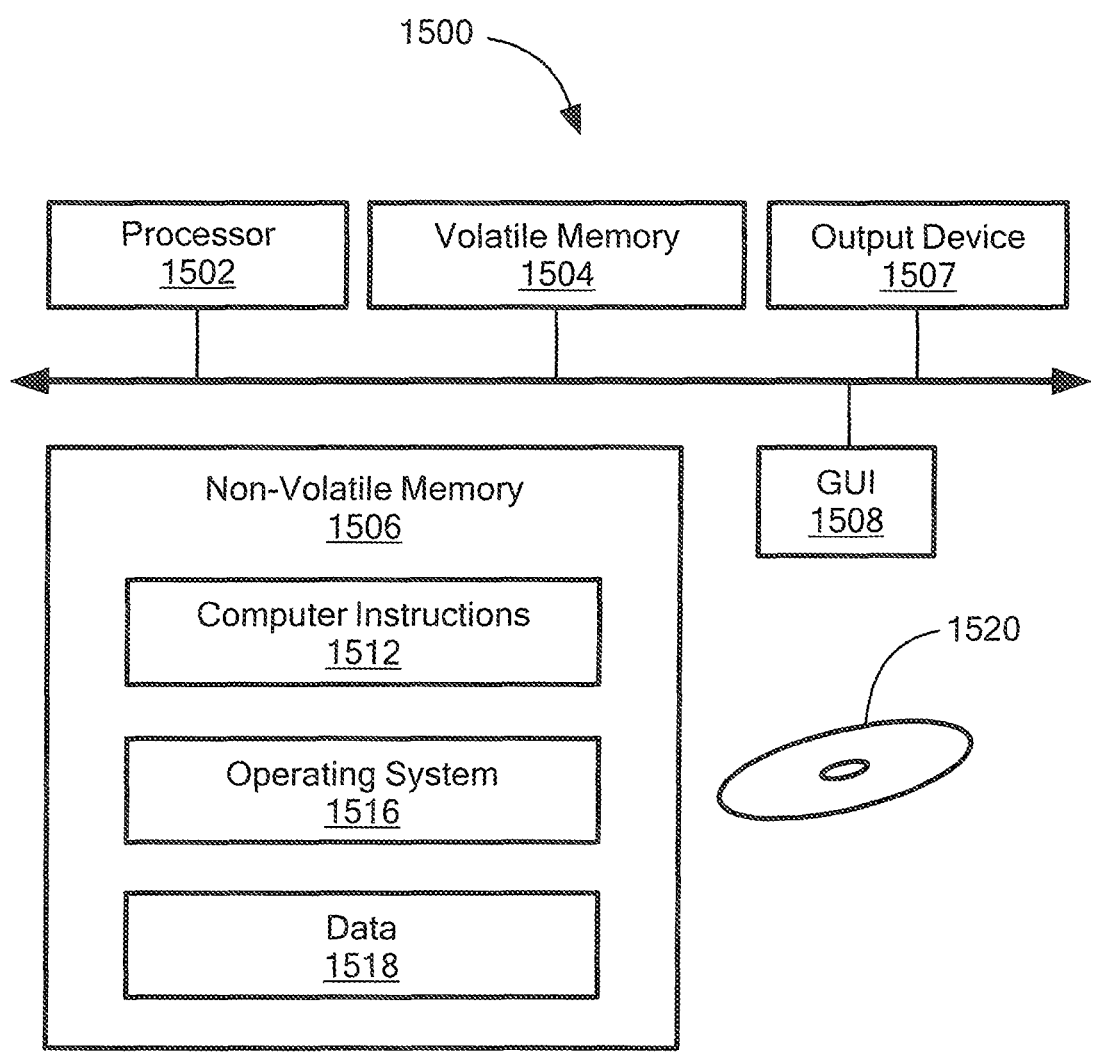
FIG. 15 shows an illustrative computer that can perform at least a portion of the processing described herein.

FIG. 15 shows an exemplary computer 1500 that can perform at least part of the processing described herein. The computer 1500 includes a processor 1502, a volatile memory 1504, a non-volatile memory 1506 (e.g., hard disk), an output device 1507 and a graphical user interface (GUI) 1508 (e.g., a mouse, a keyboard, a display, for example). The non-volatile memory 1506 stores computer instructions 1512, an operating system 1516 and data 1518. In one example, the computer instructions 1512 are executed by the processor 1502 out of volatile memory 1504. In one embodiment, an article 1520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

All references cited herein are hereby incorporated herein by reference in their entirety. Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method comprising:
    trimming a magnetic field sensor having four magnetic field sensing elements, four coils associated with respective ones of the magnetic field sensing elements and connected by at least one conductive path such that current flows through each of the coils in a same direction, an amplifier coupled to the magnetic field sensing elements, and a back-bias magnet, all within an integrated circuit (IC) package, the trimming comprising:
        applying a first current in a first direction through each of the coils producing first fields affecting respective ones of the magnetic field sensing elements;

measuring an output of the magnetic field sensor over time and generating a first curve;
applying a second current in a second direction through the each of the coils producing second fields affecting respective ones of the magnetic field sensing elements;
measuring the output of the magnetic field sensor over time and generating a second curve;
combining the first curve and the second curve and determining normalized sensitivity data of the magnetic field sensing elements, the normalized sensitivity data of the magnetic field sensing elements being consistent over changes in an external field applied to the magnetic field
sensing elements due at least in part to the back-bias magnet within the IC package;
storing the normalized sensitivity data of the magnetic field sensing elements in a memory; and
adjusting an absolute gain of the amplifier according to the stored normalized sensitivity data of the magnetic field sensing elements;
wherein each of the coils has more than one turn and is wound in a single direction.

2. The method according to claim 1, wherein a first polarity of the external field is negative.

3. The method according to claim 1, wherein the normalized sensitivity data of the magnetic field sensing elements corresponds to an average of the first and second curves.

4. The method according to claim 1, wherein the coils are integrated with respective ones of the magnetic field sensing elements.

5. The method according to claim 1, wherein the trimming comprises determining an absolute sensitivity of the magnetic field sensor in LSB per mA.

6. The method according to claim 1, wherein the trimming comprises determining an absolute sensitivity of the magnetic field sensor in LSB per Gauss.

7. The method according to claim 1, wherein the coils are integrated in silicon in which the magnetic field sensing is elements are disposed.

8. The method according to claim 1, wherein the magnetic field sensing elements comprise Hall elements.

9. The method according to claim 1, further including determining a sensitivity of the coils while no external magnetic field is applied prior to packaging the magnetic sensing elements.

10. The method of claim 1, wherein adjusting the absolute gain of the amplifier comprises adjusting the absolute gain of the amplifier during a production test of the magnetic field sensor.

11. The method of claim 1, wherein the amplifier is a front end analog amplifier.

12. The method of claim 1, wherein storing the normalized sensitivity data of the magnetic field sensing elements in a memory comprises storing the normalized sensitivity data in a programmable read-only memory (PROM).

13. The method of claim 1, wherein the coils are connected in series by the at least one conductive path.

14. The method of claim 1, wherein a first pair of the coils are connected in series, a second pair of the coils are connected in series, and the first pair of coils and the second pair of coils are connected in parallel.

15. A device, comprising:
a magnetic field sensor having a four magnetic field sensing elements, four coils associated with respective ones of the magnetic field sensing elements and connected by at least one conductive path such that current flows through each of the coils in a same direction, an amplifier coupled to the magnetic field sensing elements, and a back-bias magnet all within an integrated circuit (IC) package;
a coil driver circuit configured to:
apply, during a first time period, a first current in a first direction through each of the coils and produce a first field affecting the first magnetic field sensing elements, and
apply, during a second time period, a second current in a second direction through the each of the coils and produce a second field affecting the magnetic field sensing elements;
a memory; and
a signal processor configured to:
measure an output of the magnetic field sensor over the first time period and generate a first curve;
measure the output of the magnetic field sensor over the second time period and generate a second curve;
combine the first curve and the second curve and determine normalized sensitivity data of the magnetic field sensing elements, the normalized sensitivity data of the magnetic field sensing elements being consistent over changes in an external field applied to the magnetic field sensing elements due at least in part to the back-bias magnet within the IC package;
store the normalized sensitivity data of the first magnetic field sensing elements in the memory; and
adjust an absolute gain of the amplifier according to the stored normalized sensitivity data of the magnetic field sensing elements;
wherein each of the coils has more than one turn and is wound in a single direction.

16. The device according to claim 15, wherein the normalized sensitivity data of the magnetic field sensing elements corresponds to an average of the first and second curves.

17. The device according to claim 15, wherein the coils are integrated with respective ones of the magnetic field sensing elements.

18. The device according to claim 15, wherein the signal processor is further configured to determine an absolute sensitivity of the magnetic field sensor in LSB per mA.

19. The device according to claim 15, wherein the magnetic field sensing elements comprise Hall elements.

20. The device according to claim 15, wherein the signal processor is further configured to determine a sensitivity of the coils while no external magnetic field is applied prior to packaging the magnetic sensing elements.

21. The device of claim 15, wherein the coils are connected in series by the at least one conductive path.

22. The device of claim 15, wherein a first pair of the coils are connected in series, a second pair of the coils are connected in series, and the first pair of coils and the second pair of coils are connected in parallel.

* * * * *

UNITED STATES PATENT AND TRADEMARK OFFICE
CERTIFICATE OF CORRECTION

PATENT NO. : 11,402,440 B2
APPLICATION NO. : 14/801997
DATED : August 2, 2022
INVENTOR(S) : Virag V. Chaware et al.

It is certified that error appears in the above-identified patent and that said Letters Patent is hereby corrected as shown below:

In the Specification

Column 7, Line 30 delete "hail" and replace with --Hall--.

Column 9, Line 64 delete "NCS1. NCS2" and replace with --NCS1, NCS2--.

Column 10, Line 20 delete "/d($_{coil}$)" and replace with --/d($_{lcoil}$)--.

Column 10, Line 26 delete "SKI" and replace with --SPU--.

Column 13, Line 14 delete "field" and replace with --field;--.

Column 13, Lines 39-40 delete "is elements" and replace with --elements--.

Column 14, Lines 33-34 delete "first magnetic" and replace with --magnetic--.

Signed and Sealed this
Fifth Day of December, 2023

Katherine Kelly Vidal
*Director of the United States Patent and Trademark Office*